United States Patent [19]

Garner

[11] Patent Number: 4,648,007

[45] Date of Patent: Mar. 3, 1987

[54] COOLING MODULE FOR ELECTRONIC EQUIPMENT

[75] Inventor: Robin E. Garner, Rolling Meadows, Ill.

[73] Assignee: GTE Communications Systems Corporation, Northlake, Ill.

[21] Appl. No.: 791,828

[22] Filed: Oct. 28, 1985

[51] Int. Cl.⁴ .............................................. H05K 7/20
[52] U.S. Cl. .................................. 361/384; 98/121.2; 165/101; 165/137
[58] Field of Search ................ 361/384; 165/101, 137; 98/116, 121.1, 121.2

[56] References Cited

U.S. PATENT DOCUMENTS 1,532,635  4/1925  Osbun .................................. 98/116
4,495,545  1/1985  Dufresne et al. .................... 361/384
4,520,425  5/1985  Ito ...................................... 361/384

Primary Examiner—A. D. Pellinen
Assistant Examiner—Morris Ginsburg
Attorney, Agent, or Firm—Robert J. Black

[57] ABSTRACT

A module for cooling equipment mounted in a frame. The module includes a plenum positioned between an upper portion and a lower portion of electronic equipment and a panel positioned across the plenum to occlude it. The panel is of multiplanar arcuate construction including a first, a second and a third panel portion each provided with an aperture in which is mounted to a fan. A pair of vanes between adjacent fans are provided. The vanes align themselves with the air flow from adjacent fans when both adjacent fans are operational and position themselves across the aperture of an adjacent fan when failed.

16 Claims, 5 Drawing Figures

COOLING MODULE FOR ELECTRONIC EQUIPMENT

BACKGROUND OF THE INVENTION

(1) Field of the Invention

The present invention relates to fan packs and, more particularly, to a fan pack in use in cooling electronic equipment mounted in an equipment frame.

(2) Background Art

Cooling modules sometimes called fan packs are very well known to those skilled in the art. In this regard, U.S. Pat. No. 3,967,874 to Calabro teaches an apparatus employing a high velocity centrifugal fan for uniformly cooling an array of printed circuit boards in a card holding file. The centrifugal fan is positioned at one side of the card file and a duct is provided below the card file connected to an output of the fan to duct cool air from the fan to a lower edge of each of the cards provided within the card file, thus to cool the cards. A screen positioned within the duct produces turbulence to reduce the velocity of air flowing in the duct and to uniformly direct the air flow to the printed wiring cards.

U.S. Pat. No. 4,502,099 to Manes et al. teaches a cooling system for electronic components wherein an air supply housing with two openings cooperates with a manifold including one opening to distribute cooling air from the air supply housing through the manifold to a card cage while the manifold is closed for normal operation and also while the manifold is extended to allow maintenance of the electronic components. When the manifold is extended for maintenance, air flows into the manifold through a first opening in the housing while the second opening is blocked by a flapper which swings down over the second opening to prevent the escape of air therethrough.

Additionally, U.S. Pat. No. 3,249,038 issued to Johnson and U.S. Pat. No. 4,385,552 issued to Nabben, both teach the use of shutters to prevent back drafts in air intake and exhaust ventilation fans.

Finally, U.S. Pat. No. 4,493,341 issued to Wieland teaches the use of multiple control vanes within a distributor unit for adjustment of the distribution of volume flows from two source openings to three outlet connections.

The above arrangements, while operating generally satisfactorily for their intended purposes, have been found to be nonapplicable to the task of cooling electronic circuitry mounted in a vertically oriented equipment frame.

SUMMARY OF THE INVENTION

The present invention provides a fan pack for cooling electronic equipment mounted in both an upper portion and a lower portion of an equipment frame. The fan pack includes a plenum mounted in the equipment frame between the upper and the lower portions of equipment, the plenum including an intake port adapted to receive cooling air passing over the lower portion of equipment and an exhaust port adapted to exhaust air over the upper portion of equipment. The fan pack additionally includes a panel occluding the plenum of nonplanar construction with a plurality of apertures formed in the panel. A fan is mounted adjacent to each of the apertures on an upstream side of the panel and a vane is positioned above and between adjacent ones of the fans. The vanes are pivoted at a lower edge of the vanes. The vanes are operated in the event of no fan failure by cooling air exhausting from the adjacent fans to a position parallel to the exhausting air flow and further operated in the event of a single fan failure to a position to at least partly occlude the failed fan thus to prevent the reverse flow of cooling air through the failed fan. The air flow from the remaining operative fans will then adjust to provide nearly uniform flow to the upper portion of the electronic equipment.

BRIEF DESCRIPTION OF THE DRAWING

An understanding of the present invention will be apparent from the following description taken in conjunction with the accompanying drawing in which.

DESCRIPTION OF THE PREFERRED EMBODIMENT

Figure 1:
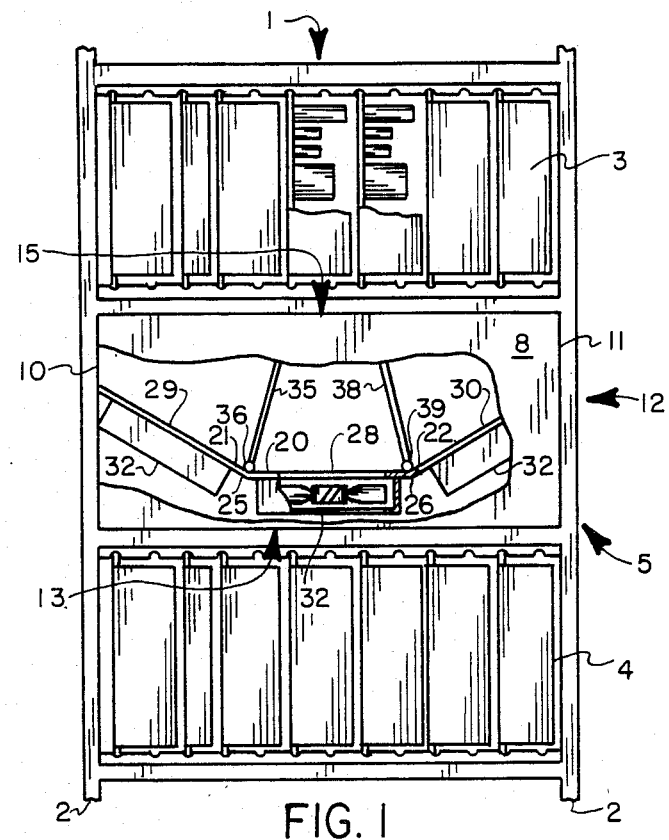
FIG. 1 is a partial view of a frame of electronic equipment employing the fan pack of the present invention.

Referring now to FIG. 1 there is shown a frame of electronic equipment 1 including a pair of uprights 2 supporting an upper portion of electronic equipment 3 and a lower portion of electronic equipment 4. Positioned between the upper portion of electronic equipment 3 and a lower portion of electronic equipment 4 is a fan pack 5 of the present invention.

The fan pack 5 includes a front wall 8, a rear wall 9, a left side wall 10, and a right side wall 11, the above mentioned walls forming a plenum 12 of rectangular construction. The plenum 12 includes a lower intake port 13 and an upper exhaust port 15. The lower intake port 13 is positioned above the lower portion of electronic equipment 4 and is adapted to accept cooling air exiting from the equipment 4. The exhaust port 15 is positioned below the upper portion of electronic equipment 3 and is adapted to exhaust cooling air to the equipment 3.

A panel 18 of multiplanar arcuate construction is provided within the fan pack 5 occluding the plenum 12. The panel 18 includes a first planar portion 20, a second left planar portion 21 and a third right planar portion 22. The first panel portion 20 of the panel 18 is positioned centrally located laterally in the plenum 12, extending between the front wall 8 and the rear wall 9 and oriented perpendicular to an axis of air flow passing through and centrally located within the lower input port 13 and the upper exhaust port 15. The second or left planar portion 21 of the panel 18 is positioned at an acute angle to the axis of air flow, in the direction of air flow and extending between a left edge 25 of the first panel portion 20 and the left side wall 10 of the plenum 12. Similarly, the third or right panel portion 22 of the panel 18 is positioned at an opposite acute angle to the direction of air flow in the axis of air flow, and extending between a right edge 26 of the first panel portion 20 and the right side wall 11 of the plenum 12. Both the second panel portion 21 and the third panel portion 22 extend between the front wall 8 and the rear wall 9 of the plenum.

An aperture (28, 29 and 30) is formed in each of the first panel portion 20, second panel portion 21 and third panel portion 22, respectively. A fan 32 is positioned on an upstream side of each of the panel portions 20, 21 and 22 and aligned with a respective one of the panel portion apertures 28, 29 and 30. The fans 32 are each aligned along an axis passing through a point laterally centered within the plenum 12 and above the panel 18 and are arranged to receive cooling air from the intake port 13 expelling the cooling air out the exhaust port 15.

A first or left vane 35 of planar construction is provided, pivotly positioned about a lower end 36 between the front wall 8 and the rear wall 9. The pivot axis passing through the lower end 36 of the first vane 35 is positioned proximate to and on a upper side of the left edge 25 of the first panel portion 20. Similarly, a second or right vane 38 extending between the front wall 8 and rear wall 9 and pivotly positioned about a lower edge 39 is provided. The pivot axis passing through the lower edge 39 is positioned proximate to and on an upper side of the right edge 26 of the first panel portion 20. The first vane 35 may be pivoted to occlude the first aperture 28 of the first panel portion 20 or alternatively, to occlude the second aperture 29 of the second panel portion 21. The second vane 38 may be pivoted to occlude the aperture 28 of the first panel portion 20 or the third aperture 30 of the third panel portion 22.

Figure 2:
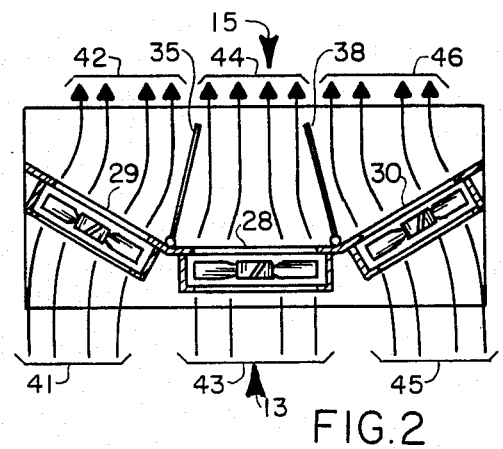
FIG. 2 is a diagrammatical representation of the fan pack of the present invention showing normal operation.

In operation and referring to FIG. 2, there is shown a diagrammatical sketch of the fan pack of the present invention depicting air flow through the plenum 12 in the event that all of the fans 32 are operating. As may be seen by the figure, cooling air entering a left portion 41 of the intake port 13 is received by the fan 32 in the left panel portion 21 and exhausted through a left portion 42 of the exhaust port 15. Additionally, cooling air entering a center portion 43 of the intake port 13 is received by the fan 32 mounted in the first panel portion 20 and exhausted through a center portion 44 of the exhaust port 15. Finally, cooling air entering a right portion 45 of the intake port 13 is received by the fan 32 in the third panel portion 22 and exhausted through a right portion 46 of the exhaust port 15. In such operation the first vane 35 and the second vane 38 will be positioned by air flow exiting the fans 32 to a position generally parallel to the flow from adjacent flows.

Figure 3:
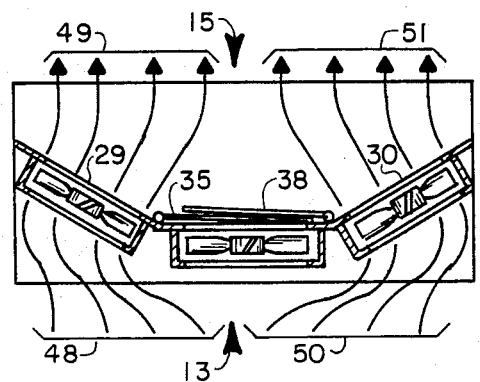
FIG. 3 is a diagrammatical sketch of the fan pack of the present invention depicting air flow in the event of failure of a center fan.

Referring now to FIG. 3, in the event of failure of the fan 32 in the first panel portion 20 centrally located within the plenum 12, the first vane 35 and the second vane 38 will pivot about their respective pivot points 36 and 39 to a position parallel to each other and over the opening 28 in the first panel portion 20 thereby blocking off or occluding same. The remaining fans 32 in the second panel portion 21 and the third panel portion 22 will then receive cooling air from a respective half of the intake port 13 and exhaust the air through a respective half portion of the exhaust port 15. In this regard, the fan 32 and the second panel portion 21 will accept cooling air from the left half 48 of the intake port 13 and exhaust the air through the left portion 49 of the exhaust port 15. Similarly, the fan 32 and the third panel portion 22 will accept air from the right half 50 of the intake port 13 and accept the cooling air through the right portion 51 of the exhaust port 15.

Figure 4:
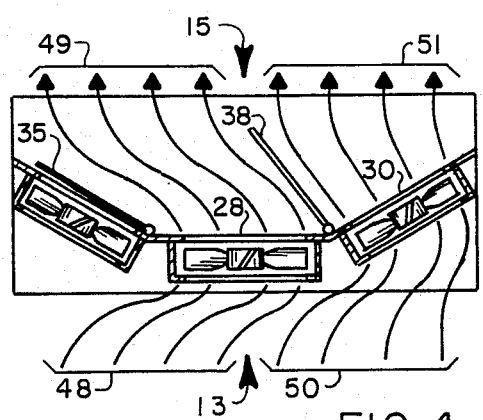
FIG. 4 is a diagrammatical representation of the fan pack of the present invention depicting air flow in the event of failure of a left positioned fan.

Referring now to FIG. 4, air flow in the event of failure of the fan 32 in the second panel portion 21 will be described. In such event, the first vane 35 will pivot to cover or occlude the aperture 29 in the second panel portion 21 thereby preventing air flow in a reverse direction through the fan 32 in that panel portion. Additionally, the fan 32 in the first panel portion 20 will accept cooling air from the left half 48 of the intake port 13 and exhaust that cooling air through the left portion 49 of the exhaust port 15, while the fan 32 in the third panel portion 22 will accept cooling air from the right panel portion 50 of the intake port 13 and exhaust the air through the right portion 51 of the exhaust port 15. In such operation the second vane 38 will assume a position generally parallel to the flow of cooling air exiting the fans 32 in their first portion 20 and the third portion 22 of the panel 18.

Figure 5:
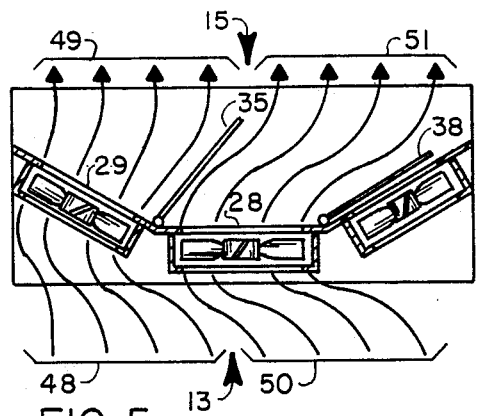
FIG. 5 is a diagrammatical representation of the fan pack of the present invention depicting air flow in the event of failure of a right positioned fan.

In similar manner and referring to FIG. 5, there is shown the air distribution through the fan pack of the present invention in the event of failure of the fan 32 in the third panel portion 22. In such case the second vane 38 will pivot to block or occlude the aperture 30 in the third panel portion 22 while the first vane 35 will assume a position generally parallel to the air flow exiting the fans 32 in the first panel portion 20 and second panel portion 21.

It is anticipated that air flow exiting the plenum 12 of the fan pack 5 may be guided in such a manner as to produce a channel of cooling air of increased capacity exiting the exhaust port 15. In this regard and referring again to FIG. 2, the vanes 35 and 38 may be provided of weighted construction and the force of gravity allowed to operate on the vanes to encourage them to pivot towards each other thereby restricting the center portion 44 of the exhaust port 15 through which air passing through the fan 32 in the first panel portion 20 may pass. Simultaneously, movement of the first vane 35 and second vane 38 will increase the portion 42 and 46 of the exhaust port 15 through which cooling air from the fans 32 in the second panel portion 21 and third panel portion 22 exhaust air. The area of increased cooling is useful in maintaining temperatures below an upper limit on circuit boards having excessive power dissipation.

Also anticipated in the present invention is placement of the fans 32 towards the front of equipment frame 1 to obtain a channel of increased air flow out of the front portion of exhaust port 15. Alternately, the fans 32 may be positioned toward the rear of equipment frame 1 to obtain a channel of increased air flow out of the rear portion of exhaust port 15.

Although the preferred embodiment of the invention has been illustrated and the forms described in detail, it will be readily apparent to those skilled in the art that various modifications may be made therein without departing from the spirit of the invention or from the scope of the appended claims.

What is claimed is:

1. A fan pack mounted in both an upper portion and a lower portion of an equipment frame for cooling electronic equipment, said fan pack comprising:
   a plenum located between said upper and said lower equipment portions, said plenum receiving via an intake port cooling air from said lower portion of said equipment frame and adapted to exhaust said cooling air to said upper portion of said equipment frame via an exhaust port;
   a panel of arcuate multiplanar construction mounted in said plenum occluding same;

a plurality of apertures formed in said panel;

a plurality of fans each located adjacent to at least one other of said fans and each mounted adjacent to a different one of said apertures, said fans arranged in an arcuate configuration, operated to draw said cooling air from said lower portion of said equipment frame and to exhaust said air to said upper portion of said equipment frame; and a plurality of vanes each positioned between adjacent ones of said fans, said vanes operated during simultaneous operation of all of said fans to a position between the direction of movement of said cooling air exhausting from said adjacent ones of said fans, and said vanes further operated in the event of failure of a single one of said fans to at least partly occlude said fan thereby to prevent reverse flow of said cooling air through said failed fan.

2. A fan pack as claimed in claim 1, wherein: said panel includes a first portion of planar construction perpendicular to an axis centrally passing through said intake port and said exhaust port.

3. A fan pack as claimed in claim 2, wherein: said panel includes a second portion of planar construction oriented at an acute angle to said axis.

4. A fan pack as claimed in claim 3, wherein: said panel includes a third panel portion oriented at an opposite acute angle to said axis.

5. A fan pack as claimed in claim 4, wherein said first panel portion is laterally centered within said plenum.

6. A fan pack as claimed in claim 5, wherein: said second panel portion is positioned between said first panel portion and an adjacent plenum sidewall on a first side of said first panel portion.

7. A fan pack as claimed in claim 6, wherein: said third panel portion is positioned between said first panel portion and an opposite adjacent plenum sidewall on a second side of said first panel portion.

8. A fan pack as claimed in claim 1, wherein: said vanes are of planar construction.

9. A fan pack as claimed in claim 2, wherein: said vanes are each adapted to pivot about a vane pivot passing through a lower end of said vane, said vane pivot being perpendicular to said axis and also perpendicular to a front and a rear wall of said plenum.

10. A fan pack as claimed in claim 3, wherein: said first, and said second panel portions are joined in a line perpendicular to said axis and perpendicular to a front and a rear wall of said plenum.

11. A fan pack as claimed in claim 10, wherein: said vanes are positioned for pivotal movement about an axis proximate and parallel to said first and said second panel portion joining line.

12. A fan pack as claimed in claim 1, wherein: a first one of said vanes is positioned in a first direction, said positioned first vane operated to concentrate air flow from a first one of said fans to produce a channel of increased air flow from said exhaust port; a second one of said vanes positioned in a second direction, said first and said second vanes positioned toward each other to produce a channel of increased air flow in said exhaust port between said first and said second vanes.

13. A fan pack as claimed in claim 1, wherein: said vanes are pivoted at a lower end of a body portion of said vane.

14. A fan pack as claimed in claim 1, wherein: said vanes are positioned upward of said fans.

15. A fan pack as claimed in claim 1, wherein: said vanes are each of essentially nonweighted construction and conform to air flow from adjacent fans, whereby to produce in conjunction with an upper portion of said plenum uniform air flow to said upper portion of equipment frame.

16. A fan pack as claimed in claim 15, wherein: in the event of failure of one fan, said vanes positioned between adjacent ones of said operated fans adjust to an expanded air flow from said operated fans.

* * * * *